(12) United States Patent
Lee et al.

(10) Patent No.: US 8,279,675 B2
(45) Date of Patent: Oct. 2, 2012

(54) NONVOLATILE MEMORY DEVICE AND METHOD OF PROGRAMMING THE SAME

(75) Inventors: Ju Yeab Lee, Gyeonggi-do (KR); Keon Soo Shim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 401 days.

(21) Appl. No.: 12/621,873

(22) Filed: Nov. 19, 2009

(65) Prior Publication Data
US 2010/0124124 A1 May 20, 2010

(30) Foreign Application Priority Data

Nov. 19, 2008 (KR) .................. 10-2008-0115016
Nov. 19, 2008 (KR) .................. 10-2008-0115017

(51) Int. Cl.
*G11C 16/04* (2006.01)

(52) U.S. Cl. .......... 365/185.18; 365/185.19; 365/185.12

(58) Field of Classification Search ............. 365/185.19, 365/185.18, 185.12
See application file for complete search history.

(56) References Cited

U.S. PATENT DOCUMENTS 7,035,144 B2 * 4/2006 Kim et al. ................ 365/185.18

FOREIGN PATENT DOCUMENTS

| KR | 1020060107689 A | 10/2006 |
| KR | 1020080114203 | 12/2008 |

OTHER PUBLICATIONS

Notice of Allowance issued from Korean Intellectual Property Office on Feb. 14, 2011.
Notice of Allowance issued from Korean Intellectual Property Office on May 31, 2010.

* cited by examiner

*Primary Examiner* — Huan Hoang
(74) *Attorney, Agent, or Firm* — IP & T Group LLP (57) ABSTRACT

A nonvolatile memory device including a bit line voltage supply unit configured to supply a power source voltage, a second voltage in which a second reference voltage has been subtracted from a third reference voltage, or a third voltage in which a first reference voltage has been subtracted from the third reference voltage according to data stored in a first latch unit, a second latch unit, and a third latch unit included in a page buffer, and a bit line voltage setting unit configured to transfer a voltage of 0 V or an output voltage of the bit line voltage supply unit to a bit line according to the data stored in the first, second, and third latch units.

27 Claims, 7 Drawing Sheets

NONVOLATILE MEMORY DEVICE AND METHOD OF PROGRAMMING THE SAME

CROSS-REFERENCES TO RELATED APPLICATIONS

Priority to Korean patent application numbers 10-2008-0115016 and 10-2008-0115017 filed on Nov. 19, 2008, the entire disclosures of which are incorporated by reference herein, is claimed.

BACKGROUND

One or more embodiments relate to a nonvolatile memory device for storing data and a method of programming the same.

Recently, there has been an increasing demand for nonvolatile memory devices, which can be electrically programmed and erased and do not require the refresh function of rewriting data at specific intervals.

The nonvolatile memory cell is configured to enable electrical program and erase operations and perform the program and erase operations through the use of threshold voltages, which vary when electrons are moved by applying a strong electric field to a thin oxide layer.

The nonvolatile memory device typically includes a memory cell array in which cells for storing data are arranged in a matrix form and a page buffer for writing data into specific cells of the memory cell array or reading data stored in a specific cell. The page buffer includes a bit line pair coupled to specific memory cells, a register for temporarily storing data to be written into the memory cell array or reading data stored in a specific memory cell of the memory cell array and temporarily storing the read data, a sense node for sensing the voltage level of a specific bit line or a specific register, and a bit line selection unit for controlling whether or not to couple the specific bit line to the sensing node.

In a method of programming the nonvolatile memory device, various types of interference phenomena are generated according to a shift in the threshold voltages of neighboring cells. In particular, in a multi-level cell (MLC) program method of storing data of two bits or more in a single cell, a malfunction resulting from the interference phenomena can occur because a margin between threshold voltages of each state becomes narrow. Accordingly, there is a need to minimize the interference phenomena resulting from the program operations of neighboring cells.

BRIEF SUMMARY

One or more embodiments relate to a nonvolatile memory device and a method of programming the same, which are capable of setting different voltages to be applied to a bit line when a program operation is performed according to the states of target program cells in order to program the target program cells to have at least respective reference voltages at about same points in time.

According to an aspect of this disclosure, a nonvolatile memory device includes a bit line voltage supply unit and a bit line voltage setting unit. The bit line voltage supply unit is configured to supply a power source voltage, a second voltage in which a second reference voltage has been subtracted from a third reference voltage, or a third voltage in which a first reference voltage has been subtracted from the third reference voltage according to data stored in a first latch unit, a second latch unit, and a third latch unit included in a page buffer. The bit line voltage setting unit is configured to transfer a voltage of 0 V or an output voltage of the bit line voltage supply unit to a bit line according to the data stored in the first, second, and third latch units.

According to another aspect of this disclosure, a nonvolatile memory device includes first, second, and third latch units coupled to a sense node and configured to store data, a bit line sense unit configured to selectively couple the sense node and a bit line selection unit together, a bit line voltage supply unit configured to supply a power source voltage, a second voltage in which a second reference voltage has been subtracted from a third reference voltage, or a third voltage in which a first reference voltage has been subtracted from the third reference voltage according to data stored in the first to third latch units, and a bit line voltage setting unit configured to drive the bit line sense unit according to the data stored in the first to third latch units and to transfer a voltage of 0 V or an output voltage of the bit line voltage supply unit to a bit line.

According to yet another aspect of this disclosure, a nonvolatile memory device may include latch units configured to latch data to be programmed into a memory cell, a control circuit configured to generate a control signal in response to outputs of the latch units, a bit line voltage supply unit configured to generate a number of selection signals in response to the outputs of the latch units and to output a selected one of a number of bit line precharge voltages in response to a number of the selection signals, and a bit line voltage setting unit configured to supply the selected bit line precharge voltage to a selected bit line in response to the control signal.

According to still another aspect of this disclosure, a method of programming a nonvolatile memory device includes providing the nonvolatile memory device on which a least significant bit (LSB) program operation has been performed, and performing a program operation by applying a program voltage to a selected word line, a pass voltage to unselected word lines, a power source voltage to a bit line coupled to a program-inhibited cell, a third voltage in which a first reference voltage has been subtracted from a third reference voltage to a bit line coupled to a first target program cell, a second voltage in which a second reference voltage has been subtracted from the third reference voltage to a bit line coupled to a second target program cell, and a voltage of 0 V to a bit line coupled to a third target program cell.

DESCRIPTION OF EMBODIMENTS

Hereinafter, some embodiments of the present disclosure will be described in detail with reference to the accompanying drawings. The drawings are provided to allow those having ordinary skill in the art to understand the scope of the embodiments of the disclosure.

Figure 1A:
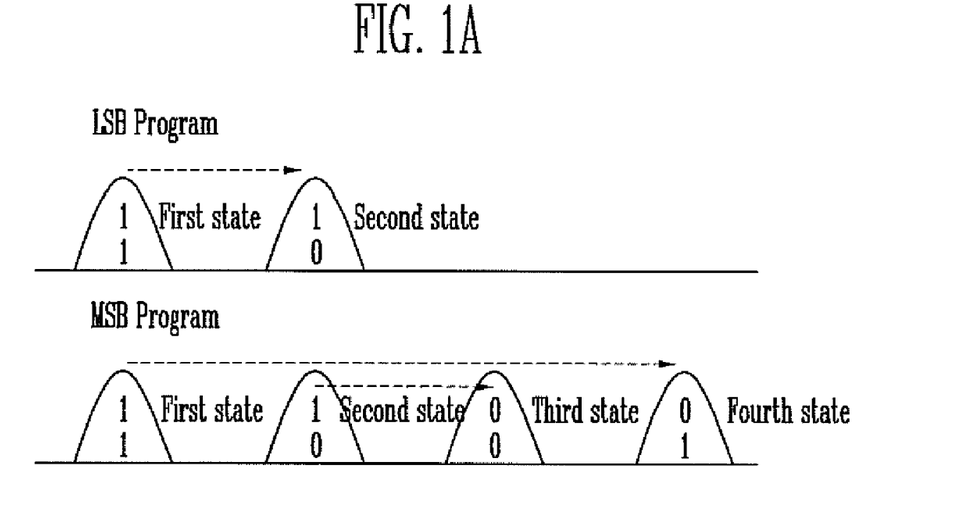
FIG. 1A is a diagram illustrating a known MLC program method of a nonvolatile memory device.
Figure 1B:
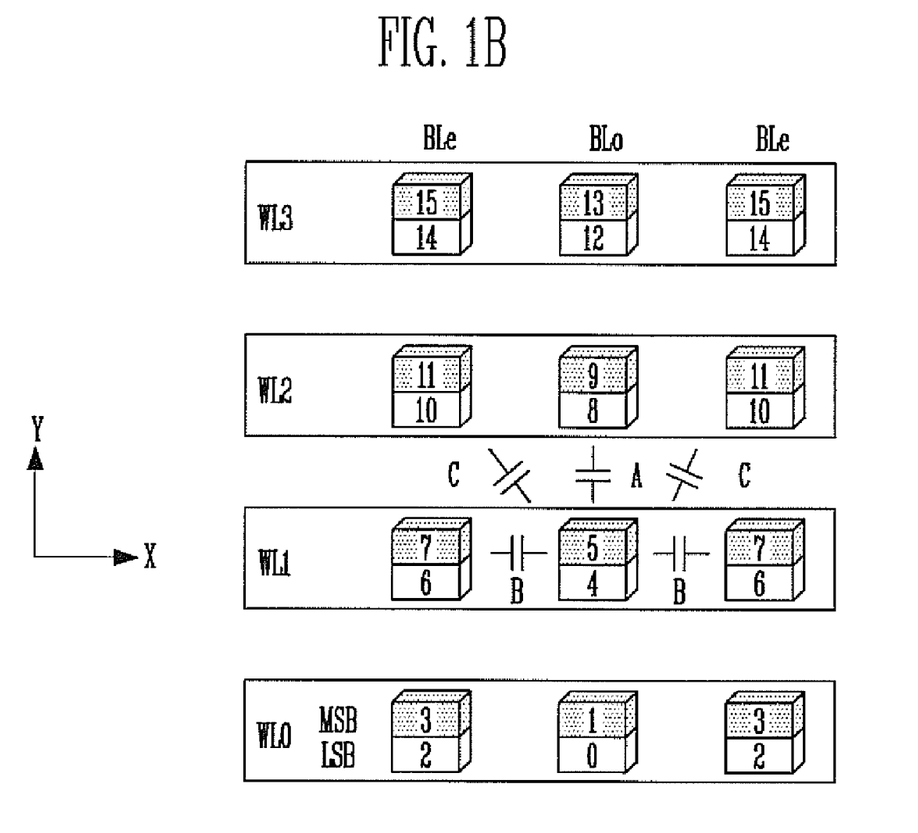
FIG. 1B is a diagram illustrating the sequence in which a program operation is performed in the MLC program method.

FIG. 1A is a diagram illustrating a known MLC program method of a nonvolatile memory device, and FIG. 1B is a diagram illustrating the sequence in which a program operation is performed in the MLC program method.

The MLC program method is a program method of storing information of 2 bits or more in a single cell. In a single level cell (SLC) program method, two states having different threshold voltages are produced by a program operation. In the MLC program method, however, information of two bits or more is stored by repeatedly performing such a program operation.

As shown, two different states (i.e., a first state and a second state) are formed by a least significant bit (LSB) program operation. The LSB program operation is performed in the same manner as an SLC program operation. In a most significant bit (MSB) operation, some cells with the first state are programmed to have a fourth state, and some cells with the second state are programmed to have a third state. As described above, the four different states can be produced by performing the LSB program operation and the MSB program operation, and so data of 2 bits can be stored in a single cell. Here, cells on which the MSB program operation has not been performed, from among the cells with the first state or the cells with the second state, maintain threshold voltages provided by the LSB program operation.

A flowchart depicting how, when such an MLC program method is actually performed, the program is performed is shown in FIG. 1B. Numbers indicated in each rectangular parallelepiped refer to the program sequences. A program is performed on cells coupled to an odd bit line BLo and is then performed on cells coupled to an even bit line BLe. It is to be noted that the above sequence may be changed by an implementer. Further, the program is sequentially performed beginning with a first word line WL0.

That is, the LSB program is first performed on the cells coupled to the odd bit line BLo, from among cells coupled to a first word line, and the MSB program is then performed on the corresponding cells. Next, a LSB program is first performed on cells coupled to an even bit line BLe, from among the cells coupled to the first word line, and an MSB program is then performed on the corresponding cells. The program operation is performed according to the above sequence.

In this case, cells indicated by '4' and '5' experience interference phenomena resulting from cells on which a subsequent program operation is performed. That is, 'A' indicates the coupling ratio resulting from a program operation for neighboring cells 8 and 9 in the Y direction, 'B' indicates the coupling ratio resulting from a program operation for neighboring cells 6 and 7 in the X direction, and 'C' indicates the coupling ratio resulting from a program operation for neighboring cells 10 and 11 in a diagonal direction. Such interference phenomena are generated when the program operation for the neighboring cells is performed after the program operation for cells 4 and 5 is completed.

To prevent the interference phenomena (in particular, the interference phenomenon in the X direction), another program method has been proposed.

Figure 2A:
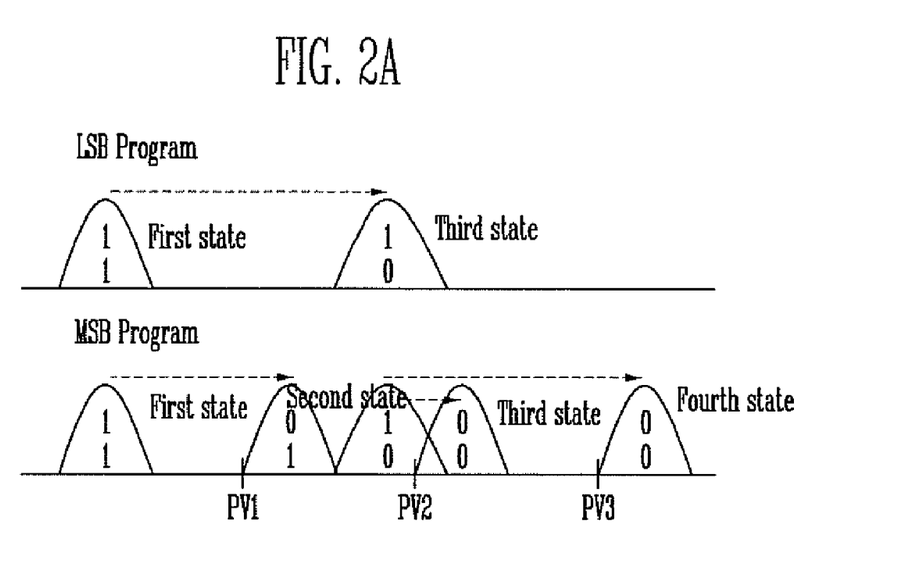
FIG. 2A is a diagram illustrating another known MLC program method of a nonvolatile memory device.
Figure 2B:
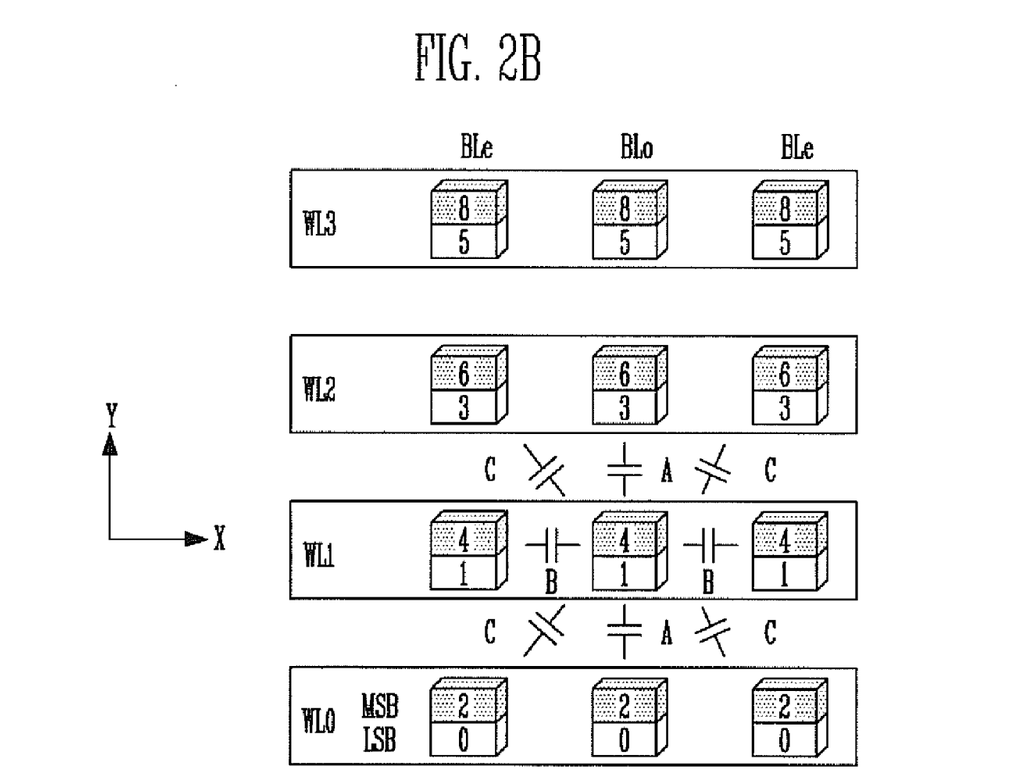
FIG. 2B is a diagram illustrating the sequence in which a program operation is performed in the MLC program method.

FIG. 2A is a diagram illustrating another known MLC program method of a nonvolatile memory device, and FIG. 2B is a diagram illustrating the sequence in which a program operation is performed in the MLC program method.

As shown, two different states (i.e., a first state and a third state) are formed by a LSB program operation. Through a MSB program operation, some cells with the first state are programmed to have a second state, and some cells with the third state are programmed to have a fourth state. Unlike in FIG. 1A, the cells with the fourth state experience a relatively small amount of shift in the threshold voltages because they originally were cells with the third state. Thus, an interference phenomenon can be reduced. Meanwhile, unlike in FIG. 1A, even in the case where cells with the third state remain as cells with the third state, the threshold voltages of these cells slightly rise.

Such an MLC program method can be performed as shown in FIG. 2B. Herein, a sequence in which the MLC program method is performed can be changed by an implementer.

Referring to FIG. 2B, the same program is performed without assigning separate sequences to respective bit lines. That is, a LSB program operation is performed on all cells coupled to a first word line. Next, a LSB program operation is performed on all cells coupled to a second word line, and an MSB program operation is performed on all cells coupled to the first word line. Such a program method is called an all bit-line (ABL) program method.

Even in this method, interference in the Y direction and the diagonal direction still occurs. When a cell has a different target state from neighboring cells, interference in the X direction is also generated.

In FIG. 1A, the greatest interference phenomenon for neighboring cells occurs where cells are programmed to change from the first state to the fourth state. In FIG. 2A, the greatest interference phenomenon for neighboring cells occurs where cells are programmed to change from the third state to the fourth state. Although interference in the X direction can be slightly reduced due to a reduced shift in the threshold voltages, such a reduction is not sufficient. Accordingly, the present disclosure presents a method that reduces the interference phenomena.

Figure 3A:
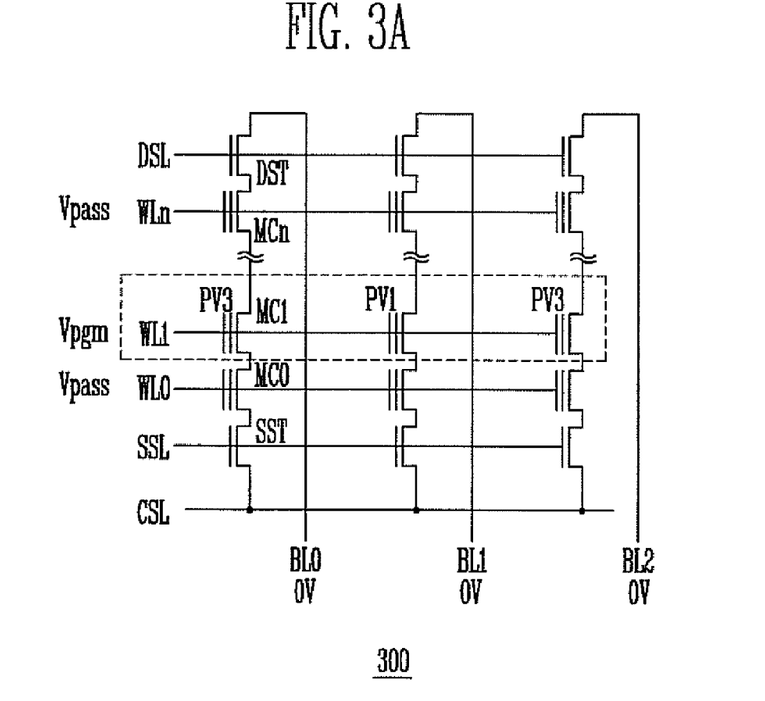
FIGS. 3A and 3B are diagrams illustrating the concept of a known program method of a nonvolatile memory device.
Figure 3B:
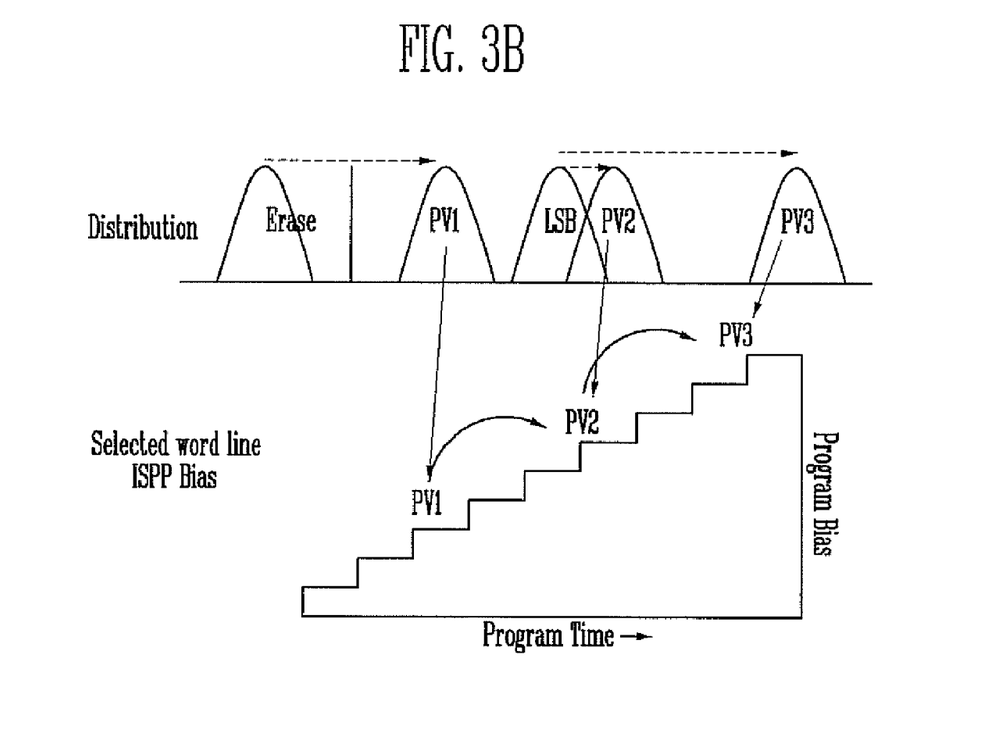

FIGS. 3A and 3B are diagrams illustrating the concept of a known program method of a nonvolatile memory device.

The nonvolatile memory device includes a memory cell array configured to include a number of memory cells and a page buffer coupled to the memory cells and configured to program data into the memory cells or read data stored in the memory cells. In the drawing, only part of the memory cell array 300 is illustrated as an example.

The memory cell array 300 includes memory cells MC0 to MCn configured to store data, word lines WL0 to WLn configured to select and activate the memory cells MC, and bit lines BL0, BL1, and BL2 configured to input or output data of the memory cells MC. A plurality of the word lines WL and a plurality of the bit lines BL are arranged in a matrix form.

The memory cell array 300 also includes drain select transistors DST coupled between the bit lines and the memory cells MC and source select transistors SST coupled between a common source line CSL and the memory cells MC. The memory cell array 300 further includes a plurality of the memory cells MC coupled in series between each source select transistor SST and each drain select transistor DST, which is referred to as a cell string. The gates of the memory cells MC are coupled to the respective word lines WL. A set of the memory cells MC commonly coupled to the same word line is referred to as a page. Further, a plurality of the strings coupled in parallel to the common source line is referred to as a memory cell block.

In the known program operation of the nonvolatile memory device, whether or not a program operation on a corresponding cell will be performed is determined according to voltage applied to a word line WL and voltage applied to a bit line BL. A program voltage (Vpgm) is applied to a word line WL coupled to a cell that is to be programmed with a reference voltage or more, and a pass voltage (Vpass) lower than the program voltage is applied to the remaining word lines WL. The pass voltage has a voltage range that prevents a program operation by FN tunneling from occurring, and when applied turns on each memory cell MC irrespective of the states of the memory cells MC. Whether to program cells included in the word line WL to which the program voltage (Vpgm) is applied (i.e., cells within the same page) is determined according to voltage applied to a bit line BL. Typically, a bit line BL coupled to a cell to be programmed is maintained at 0 V, and a power source voltage (Vcc) is applied to a bit line BL coupled to a program-inhibited cell or a cell to be erased. Accordingly, the program voltage (Vpgm) is applied to the gate of the cell to be programmed and 0 V is applied to the channel of the cell, so a program by FN tunneling is performed. On the contrary, when the program voltage (Vpgm) is applied to the gate of a program-inhibited cell of the word line WL and the power source voltage (Vcc) is applied to the channel of the cell, a program by FN tunneling is not performed.

FIG. 3B shows conditions in which threshold voltages rise on a state basis with a program operation in accordance with an incremental step pulse program (ISPP) method. In the ISPP operation, a program operation and a verification operation are repeatedly performed, wherein the program voltage is repeatedly increased by a step voltage.

Meanwhile, memory cells are classified as follows according to states in which the cells are to be programmed. The memory cells are classified into cells programmed with a third reference voltage (PV3) or more (i.e., third target program cells), cells programmed with a second reference voltage (PV2) or more, but less than the third reference voltage (PV3) (i.e., second target program cells), cells programmed with a first reference voltage (PV1) or more, but less than the second reference voltage (PV2) (i.e., first target program cells), and program-inhibited cells.

As shown, since the first target program cells have the lowest reference voltage, a program is for the first time completed beginning with the first target program cells. In other words, during a program operation according to the ISPP method, a program voltage applied, when a program for the first target program cells is completed, is less than that applied to other cells. Next, a program for the second target program cells having the second lowest reference voltage is completed, and a program for the third target program cells having the highest reference voltage is completed.

As described above, a point of time at which a program is completed becomes later as the reference voltage increases. Thus, an ISPP voltage applied rises when a program operation is completed.

In this case, it is assumed that, as shown in FIG. 3A, the third target program cells neighbor the first target program cells. After the first target program cells are programmed with the first reference voltage (PV1) or more, the third target program cells are programmed with the third reference voltage (PV3) or more. Thus, the first target program cells may experience an interference phenomenon resulting from the program for the third target program cells. In particular, the threshold voltages of the third target program cells shift from a LSB state to the third reference voltage causing the interference phenomenon for the first target program cells. Moreover, the greater the amount of the shift, the greater the interference phenomenon for the first target program cells.

Figure 4A:
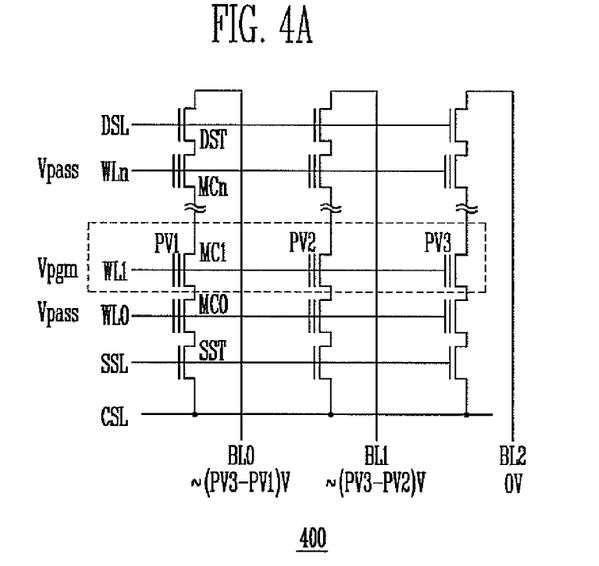
FIGS. 4A and 4B are diagrams illustrating the concept of a method of programming a nonvolatile memory device according to an embodiment of this disclosure.
Figure 4B:
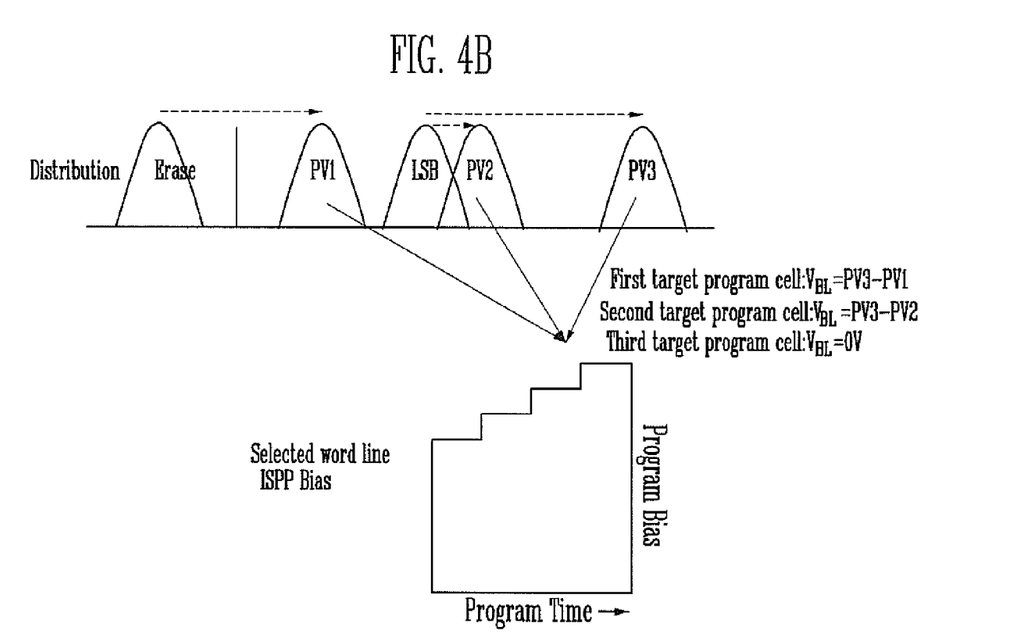

FIGS. 4A and 4B are diagrams illustrating the concept of a method of programming a nonvolatile memory device according to an embodiment of this disclosure.

The nonvolatile memory device includes a memory cell array configured to include a number of memory cells and a page buffer coupled to the memory cells and configured to program data into the memory cells or read data stored in the memory cells. In the drawing, only part of the memory cell array 400 is illustrated as an example.

The memory cell array 400 includes memory cells MC0 to MCn configured to store data, word lines WL0 to WLn configured to select and activate the memory cells MC, and bit lines BL0, BL1, and BL2 configured to input or output data of the memory cells MC. A plurality of the word lines WL and a plurality of the bit lines BL are arranged in a matrix form.

The memory cell array 400 also includes drain select transistors DST coupled between the bit lines BL and the memory cells MC and source select transistors SST coupled between a common source line CSL and the memory cells MC. The memory cell array 400 further includes a plurality of the memory cells MC coupled in series between each source select transistor SST and each drain select transistor DST, which is referred to as a cell string. The gates of the memory cells MC are coupled to the respective word lines WL. A set of the memory cells MC commonly coupled to the same word line is referred to as a page. Further, a plurality of the strings coupled in parallel to the common source line is referred to as a memory cell block.

In the known program operation of the nonvolatile memory device, whether or not a program operation on a corresponding cell will be performed is determined according to voltage applied to a word line WL and voltage applied to a bit line BL. A program voltage (Vpgm) is applied to a word line WL coupled to a cell that is to be programmed with a reference voltage or more, and a pass voltage (Vpass) lower than the program voltage is applied to the remaining word lines WL. The pass voltage has a voltage range that prevents a program operation by FN tunneling from occurring, and when applied turns on each memory cell irrespective of the states of the memory cells MC. Whether to program cells included in the word line WL to which the program voltage (Vpgm) is applied (i.e., cells within the same page) is determined according to voltage applied to a bit line BL. Typically, a bit line BL coupled to a cell to be programmed is maintained to 0 V, and a power source voltage (Vcc) is applied to a bit line BL coupled to a program-inhibited cell or a cell to be erased. Accordingly, the program voltage (Vpgm) is applied to the gate of the cell to be programmed and 0 V is applied to the channel of the cell, so a program by FN tunneling is performed. However, when the program voltage (Vpgm) is applied to the gate of a program-inhibited cell of the word line WL and the power source voltage (Vcc) is applied to the channel of the cell, a program by FN tunneling is not performed.

In the present embodiment, utilizing an MLC program method, voltages applied on a bit-line basis are variably set according to the state of memory cells to be programmed. In this method, memory cells are classified as follows according to states in which the cells are to be programmed. The memory cells are classified into cells programmed with a third reference voltage (PV3) or more (i.e., third target program cells), cells programmed with a second reference voltage (PV2) or more, but less than the third reference voltage (PV3) (i.e., second target program cells), cells programmed with a first reference voltage (PV1) or more, but less than the second reference voltage (PV2) (i.e., first target program cells), and program-inhibited cells.

In the present embodiment, utilizing an MLC program operation, points of times at which target program cells are programmed are almost identical. To this end, when a program operation is performed, different bit line voltages are set according to the target program cells.

First, a power source voltage (Vcc) is applied to a bit line coupled to the program-inhibited cells.

A voltage of 0 V is applied to a bit line coupled to the third target program cells.

Also, a voltage (PV3−PV2) in which the second reference voltage has been subtracted from the third reference voltage is applied to a bit line coupled to the second target program cells. Finally, a voltage (PV3−PV1) in which the first reference voltage has been subtracted from the third reference voltage is applied to a bit line coupled to the first target program cells. That is, a voltage in which a reference voltage according to each state has been subtracted from the highest reference voltage (PV3) is applied to a bit line. Here, the first reference voltage is approximately set to 0.3 to 0.8 V, the second reference voltage is approximately set to 2.0 to 2.5 V, and the third reference voltage is approximately set to 3.5 to 4.0 V. Accordingly, the voltage (PV3−PV2) in which the second reference voltage has been subtracted from the third reference voltage becomes 2.0 to 1.0 V, and the voltage (PV3−PV1) in which the first reference voltage has been subtracted from the third reference voltage becomes 3.7 to 2.7 V.

The program operations for the cells are performed at the same time based on applying such voltages to the appropriate bit lines. The effects of the above program method are described below.

For the purpose of explaining the effects, it is assumed that the third target program cells neighbor the first target program cells in the left and right directions (i.e., the X direction) of the first target program cells. It is also assumed that a program voltage is applied according to the ISPP method. That is, a program operation and a verification operation are repeatedly performed, wherein the program voltage is repeatedly increased by a step voltage.

In typical cases, a voltage of 0 V is applied to all bit lines coupled to the first, second, and third target program cells. In a verification operation, a program for the first target program cells is completed first because the first target program cells have the lowest reference voltage (PV1). Next, a program voltage is gradually increased, and programs for the second target program cells and the third target program cells are then completed. Here, given the above assumptions, after the program for the first target program cells is completed, an interference phenomenon is generated by the completion of the program for the third target program cells neighboring the first target program cells.

In this embodiment, however, the bit line voltages of the first and second target program cells are increased by respective amounts such that the program operations for the first and second target program cells are performed at about the same time that the program operation for the third target program cells is performed. Since the programs for the first, second, and third target program cells are completed at about the same time, program voltages when the programs are completed are almost identical. Accordingly, interference in the X direction can be reduced.

A nonvolatile memory device configured to supply a different bit line voltage based on a state of the memory cells to be programmed is described below.

Figure 5:
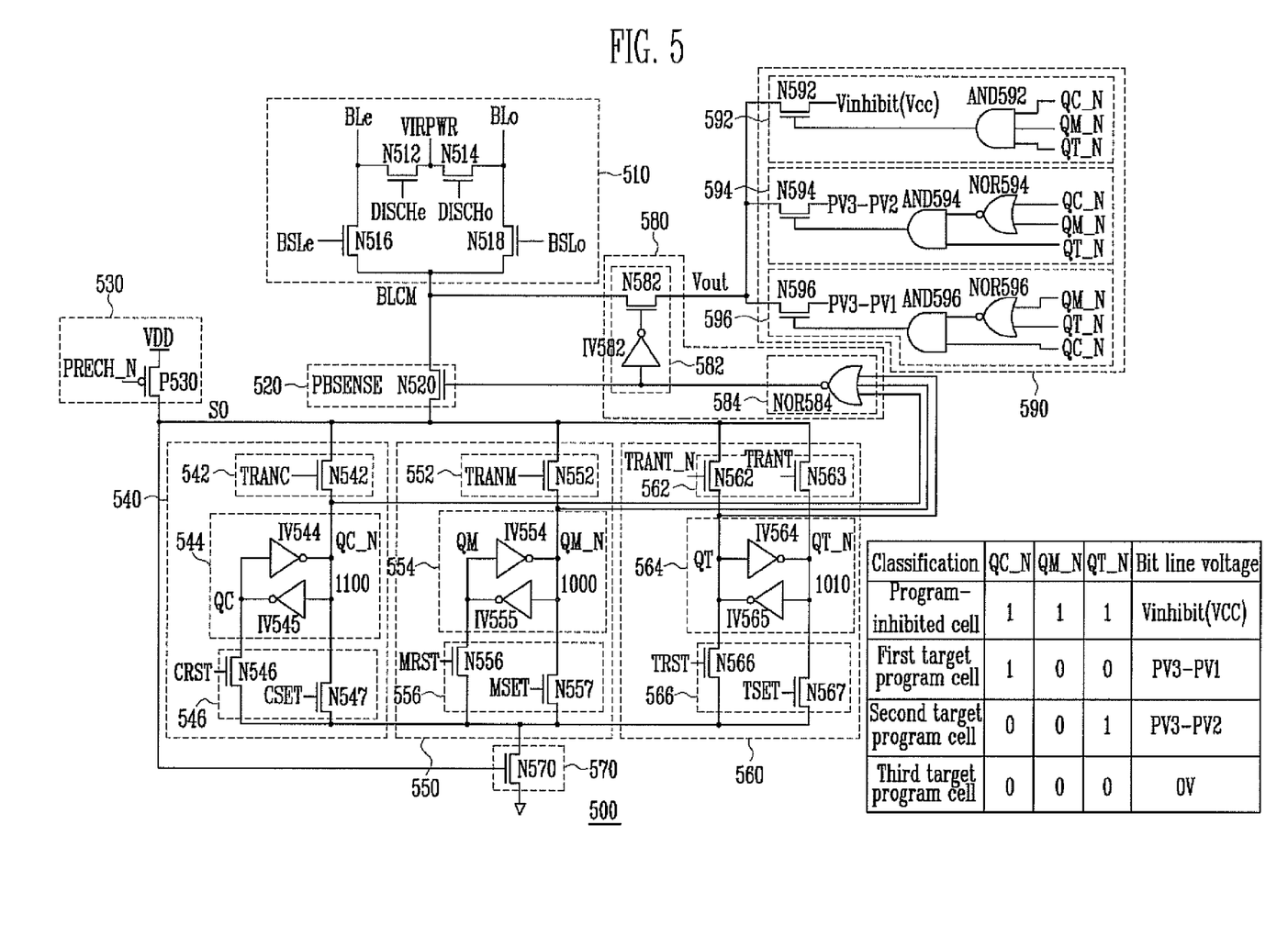
FIG. 5 is a circuit diagram of the page buffer of a nonvolatile memory device according to an embodiment of this disclosure.

FIG. 5 is a circuit diagram of a page buffer of a nonvolatile memory device to which the present disclosure is applied.

The page buffer 500 includes a bit line selection unit 510, a bit line sense unit 520, a sense node precharge unit 530, a first latch unit 540, a second latch unit 550, a third latch unit 560, a sense node sense unit 570, a bit line voltage setting unit 580, and a bit line voltage supply unit 590.

Of the above elements, the latch units 540, 550, and 560, the bit line voltage setting unit 580, and the bit line voltage supply unit 590 are indispensable elements of the nonvolatile memory device according to the present disclosure.

The latch units 540, 550, and 560 are configured to latch data for programming a memory cell. For example, data for programming a memory cell at the highest voltage level or other voltage levels is latched in the latch units 540, 550, and 560.

The control circuit 584 of the bit line voltage setting unit 580 is configured to generate a control signal in response to the outputs of the latch units 540, 550, and 560. For example, when memory cells are programmed with the highest level, the control circuit 584 can output the control signal of a first level. When the memory cells are programmed with other levels, the control circuit 584 can output the control signal of a second level.

The bit line voltage supply unit 590 is configured to generate a number of selection signals in response to the outputs of the latch units 540, 550, and 560 and to output a selected one of a number of bit line precharge voltages (Vcc, PV3−PV2, and PV3−Pv1) in response to the selection signals.

The bit line voltage transfer unit 582 of the bit line voltage setting unit 580 is configured to transfer the selected bit line precharge voltage, received from the bit line voltage supply unit 590, to a selected bit line in response to the control signal generated by the control circuit 584.

A construction in which the indispensable elements and the remaining elements are coupled together and an operation thereof are described in detail below.

The bit line selection unit 510 includes an NMOS transistor N516 configured to couple an even bit line BLe and a sense node SO together in response to a first bit line selection signal (BSLe) and an NMOS transistor N518 configured to couple an odd bit line BLo and the sense node SO in response to a second bit line selection signal (BSLo). The bit line selection unit 510 further includes a variable voltage input terminal configured to apply a variable voltage (VIRPWR) of a specific level, an NMOS transistor N512 configured to couple the even bit line BLe and the variable voltage input terminal together in response to a first discharge signal (DISCHe), and an NMOS transistor N514 configured to couple the odd bit line BLo and the variable voltage input terminal in response to a second discharge signal (DISCHo). A specific bit line and the sense node SO may be selectively coupled together according to the above construction.

The bit line sense unit 520 is turned on in response to a bit line sense signal (PBSENSE) and is configured to include an NMOS transistor N520 coupled to the bit line selection unit 510 and the sense node SO. Here, a node of the bit line selection unit 510 and the bit line sense unit 520 is called a bit line common node BLCM. When verification and read operations are performed, the bit line sense unit 520 applies a sense voltage so that the state of a specific memory cell can be transferred to the sense node SO. In some embodiments, the bit line sense unit 520 may be removed, and the bit line select transistors N516, N518 of the bit line selection unit 510 may play the role of the bit line sense unit 520.

The sense node precharge unit 530 is configured to apply a power source voltage (VDD) of a logic high level to the sense node SO in response to a precharge signal (PRECH_N). To this end, the sense node precharge unit 530 includes a PMOS transistor P530 coupled between a power source voltage terminal VDD and the sense node SO. Accordingly, the power source voltage (VDD) of a logic high level is applied to the sense node SO in response to the precharge signal (PRECH_N) of a logic low level.

The sense node sense unit 570 is configured to apply a ground voltage to each of the latch units 540, 550, and 560 according to a voltage level of the sense node SO. To this end, the sense node sense unit 570 includes an NMOS transistor N570 configured to have a gate coupled to the sense node SO and coupled between the latch units 540, 550, and 560 and the ground terminal. Accordingly, the ground voltage is applied to each of the latch units according to a voltage level of the sense node SO.

The first latch unit 540 includes a latch 544 configured to store data, a data setting unit 546 configured to transfer the ground voltage, received from the sense node sense unit 570, to the latch 544 in response to data setting signals (CRST, CSET), and a data transmission unit 542 configured to transfer data stored in the first node QC_N of the latch 544 to the sense node SO.

The latch 544 includes a first inverter IV544 and a second inverter IV545 having respective input and output terminals coupled together. A node of the output terminal of the first inverter IV544 and the input terminal of the second inverter IV545 is called a first node QC_N, and a node of the input terminal of the first inverter IV544 and the output terminal of the second inverter IV545 is called a second node QC. Accordingly, data of different levels are stored in the first node QC_N and the second node QC.

The data setting unit 546 includes an NMOS transistor N547 configured to supply the first node QC_N with the ground voltage received from the sense node sense unit 570 in response to a first data setting signal (CSET), and an NMOS transistor N546 configured to supply the second node QC with the ground voltage received from the sense node sense unit 570 in response to the second data setting signal (CRST).

The data transmission unit 542 includes an NMOS transistor N542 configured to transfer data, stored in the first node QC_N of the latch 544, to the sense node SO in response to a data transmission signal (TRANC). Accordingly, when the data transmission signal (TRANC) is applied, data stored in the first node QC_N can be transferred to the sense node SO.

The second latch unit 550 includes a latch 554 configured to store data, a data setting unit 556 configured to transfer the ground voltage, received from the sense node sense unit 570, to the latch 554 in response to data setting signals (MRST, MSET), and a data transmission unit 552 configured to transfer data, stored in the first node QM_N of the latch 554, to the sense node SO.

The latch 554 includes a first inverter IV554 and a second inverter IV555 having respective input and output terminals coupled together. A node of the output terminal of the first inverter IV554 and the input terminal of the second inverter IV555 is called a first node QM_N, and a node of the input terminal of the first inverter IV554 and the output terminal of the second inverter IV555 is called a second node QM. Accordingly, data of different levels are stored in the first node QM_N and the second node QM.

The data setting unit 556 includes an NMOS transistor N557 configured to supply the first node QM_N with the ground voltage received from the sense node sense unit 570 in response to the first data setting signal MSET, and an NMOS transistor N556 configured to supply the second node QM with the ground voltage received from the sense node sense unit 570 in response to the second data setting signal MRST.

The data transmission unit 552 includes an NMOS transistor N552 configured to transfer data, stored in the first node QM_N of the latch 554, to the sense node SO in response to a data transmission signal (TRANM). Accordingly, when the data transmission signal (TRANM) is applied, data stored in the first node QM_N can be transferred to the sense node SO.

The third latch unit 560 includes a latch 564 configured to store data, a data setting unit 566 configured to transfer the ground voltage, received from the sense node sense unit 570, to the latch 564 in response to data setting signals (TRST, TSET), and a data transmission unit 562 configured to transfer data, stored in the first node QT_N of the latch 564, to the sense node SO.

The latch 564 includes a first inverter IV564 and a second inverter IV565 having respective input and output terminals coupled together. A node of the output terminal of the first inverter IV564 and the input terminal of the second inverter IV565 is called a first node QT_N, and a node of the input terminal of the first inverter IV564 and the output terminal of the second inverter IV565 is called a second node QT. Accordingly, data of different levels are stored in the first node QT_N and the second node QT.

The data setting unit 566 includes an NMOS transistor N567 configured to supply the first node QT_N with the ground voltage received from the sense node sense unit 570 in response to the first data setting signal (TSET), and an NMOS transistor N566 configured to supply the second node QT with the ground voltage received from the sense node sense unit 570 in response to the second data setting signal TRST.

The data transmission unit 562 includes an NMOS transistor N563 configured to transfer data, stored in the first node QT_N of the latch 564, to the sense node SO in response to a data transmission signal TRANT. Accordingly, when the data transmission signal TRANT is applied, data stored in the first node QT_N can be transmitted to the sense node SO. Also, the data transmission unit 562 further includes another NMOS transistor N562 configured to transfer data, stored in the second node QT of the latch 564, to the sense node SO in response to a data transmission signal TRANT_N.

As a result of the construction, including the three latch units as described above, the program state of each memory cell can be determined according to data stored in the latch units. That is, in the case where data '1' is stored in the first nodes of all three of the latch units 540, 550, and 560, as shown in FIG. 5, a memory cell coupled to a corresponding page buffer is a program-inhibited cell. In the case where data '1' is stored in the first node QC_N of the first latch unit 540 and data '0' is stored in the first nodes of the remaining latch units, a memory cell coupled to a corresponding page buffer becomes a first target program cell. In the case where data '1' is stored in the first node QT_N of the third latch unit 560 and data '0' is stored in the first nodes of the remaining latch units, a memory cell coupled to a corresponding page buffer becomes a second target program cell. Furthermore, in the case where data '0' is stored in the first nodes of all the latch units, a memory cell coupled to a corresponding page buffer becomes a third target program cell.

Meanwhile, the above data setting may be changed by an implementer.

The bit line voltage setting unit 580 is configured to set a voltage of 0 V or the output voltage (Vcc, PV3-PV2, or PV3-PV1) of the bit line voltage supply unit 590, such that the voltage of 0 V or the output voltage (Vcc, PV3−PV2, or PV3−PV1) is supplied to a bit line according to data stored in the latch units. To this end, the bit line voltage setting unit 580 includes the bit line voltage transfer unit 582 configured to transfer the output voltage of the bit line voltage supply unit 590 to a bit line according to data stored in the latch units, and the control circuit 584 configured to drive the bit line sense unit 520 or the bit line voltage transfer unit 582 according to data stored in the latch units.

The control circuit 584 includes a NOR gate NOR584 configured to perform a NOR operation on signals received from the first nodes of the latch units. Accordingly, when data '1' is outputted from one or more first nodes of the latch units, the NOR gate NOR584 outputs data of a logic low level. When data '0' is outputted from the first nodes of all the latch units, the NOR gate NOR584 outputs data of a logic high level.

The bit line voltage transfer unit 582 includes an inverter IV582 configured to invert an output signal of the control circuit 584 and an NMOS transistor N582 configured to couple the output terminal of the bit line voltage supply unit 590 to the bit line common node BLCM according to an output signal of the inverter IV582. Accordingly, when data '1' is outputted from one or more first nodes of the latch units, so that a signal of a logic low level is outputted from the control circuit 584, the bit line voltage transfer unit 582 operates and applies voltage of the bit line voltage supply unit 590 to the bit line common node BLCM.

Furthermore, when data '0' is outputted from the first nodes of all the latch units, so that a signal of a logic high level is outputted from the control circuit 584, the bit line sense unit 520 operates and transfers data stored in the latch units to the bit line common node BLCM. In this case, however, since the data '0' is outputted from all of the first nodes, a voltage of 0 V is applied to the bit line common node BLCM.

The bit line voltage supply unit 590 includes a first voltage supply unit 592, a second voltage supply unit 594, and a third voltage supply unit 596 configured to supply first to third voltages, respectively, according to data stored in the latch units.

The first voltage supply unit 592 includes an AND gate AND592 configured to receive data from the first nodes of the latch units, and an NMOS transistor N592 configured to selectively couple its output terminal Vout and an input terminal having the power source voltage (Vcc) together according to an output of the AND gate AND592.

Accordingly, when a memory cell is a program-inhibited cell (i.e., when data '1' is stored in the first nodes of all the latch units), the AND gate AND592 outputs a signal of a logic high level. In response thereto, the NMOS transistor N592 transfers the power source voltage (Vcc) to the output terminal Vout. The power source voltage (Vcc) transferred to the output terminal Vout is transferred to the bit line common node BLCM via the bit line voltage transfer unit 582.

The second voltage supply unit 594 includes a NOR gate NOR594 configured to receive data of the first node QC_N of the first latch unit 540 and data of the first node QM_N of the second latch unit 550, an AND gate AND594 configured to receive data of the first node QT_N of the third latch unit 560 and the output of the NOR gate NOR594, and an NMOS transistor N594 configured to selectively couple the output terminal Vout and an input terminal having the second voltage (PV3−PV2) together according to the output of the AND gate AND594.

That is, when a memory cell is the second target program cell (i.e., when data '1' is stored only in the first node QT_N of the third latch unit 560), the AND gate AND594 outputs a signal of a logic high level. Thus, the NMOS transistor N594 transfers the second voltage (PV3−PV2) in which the second reference voltage PV2 has been subtracted from the third reference voltage PV3 to the output terminal Vout. The second voltage (PV3−PV2) transferred to the output terminal Vout is transferred to the bit line common node BLCM via the bit line voltage transfer unit 582.

The third voltage supply unit 596 includes a NOR gate NOR596 configured to receive data of the first node QM_N of the second latch unit 550 and data of the first node QT_N of the third latch unit 560, an AND gate AND596 configured to receive data of the first node QC_N of the first latch unit 540 and the output of the NOR gate NOR596, and an NMOS transistor N596 configured to selectively couple the output terminal Vout and an input terminal having the third voltage (PV3−PV1) together according to the output of the AND gate AND596.

That is, when a memory cell is the first target program cell (i.e., when data '1' is stored only in the first node QC_N of the first latch unit 540), the AND gate AND596 outputs a signal of a logic high level. Thus, the NMOS transistor N596 transfers the third voltage (PV3−PV1) in which the first reference voltage PV1 has been subtracted from the third reference voltage PV3 to the output terminal Vout. The third voltage (PV3−PV1) transferred to the output terminal Vout is transferred to the bit line common node BLCM via the bit line voltage transfer unit 582.

As described above, the bit line voltage supply unit 590 is configured to transfer the power source voltage (Vcc), the second voltage (PV3−PV2), or the third voltage (PV3−PV1) to the bit line common node BLCM according to data stored in the latch units 540, 550, and 560.

The above-described nonvolatile memory device is described from a different standpoint below.

The nonvolatile memory device of this disclosure includes latches 544, 554, and 564, a control circuit 584, a bit line voltage supply unit 590, and a bit line voltage transfer unit 582.

The latches 544, 554, and 564 are configured to latch data to be programmed. That is, the latches 544, 554, and 564 are configured to store data to be stored in a selected memory cell. For example, as shown in FIG. 5, the three latches 544, 554, and 564 may be provided. A first one of the three latches 544, 554, and 564 can be used to latch data stored in a memory cell according to an LSB program operation, a second one of the three latches 544, 554, and 564 can be used to latch data to be stored in a memory cell according to an MSB program operation, and a third one of the three latches 544, 554, and 564 can be used to latch a result of a verification operation after the MSB program operation. How each of the latches is used may be changed according to an operating method.

The control circuit 584 is configured to generate a control signal according to the outputs of the latches 544, 554, and 564.

The bit line voltage supply unit 590 is configured to generate a number of selection signals (outputs of AND gates AND592, AND594, and AND596) according to the outputs of the latches 544, 554, and 564 and to output a selected one of the bit line precharge voltages (Vcc, PV3−PV2, and PV3−PV1) in response to a number of the selection signals.

The bit line voltage setting unit 580 functions to transfer the selected bit line precharge voltage to a bit line corresponding to a memory cell to be programmed. In more detail, the bit line voltage setting unit 580 functions to provide a bit line precharge voltage received from the bit line voltage supply unit 590 to a bit line to be programmed in response to a control signal generated by the control circuit 584.

Only when a memory cell is programmed, does the bit line voltage setting unit 580 transfer the bit line precharge voltage in response to the control signal. That is, when a selected memory cell is a program-inhibited cell, the bit line voltage setting unit 580 does not transfer the bit line precharge voltage. In a similar way, only when a memory cell is programmed, does the bit line voltage supply unit 590 output the bit line precharge voltage according to data latched in the latches 544, 554, and 564 (i.e., data to be programmed). When a selected memory cell is a program-inhibited cell, the bit line voltage supply unit 590 does not output the bit line precharge voltage.

Furthermore, the bit line voltage supply unit 590 outputs the bit line precharge voltages according to data to be programmed such that the bit line precharge voltages of different levels are applied to bit lines corresponding to a memory cell whose threshold voltage rises up to the PV1 level, a memory cell whose threshold voltage rises up to the PV2 level, and a memory cell whose threshold voltage rises up to the PV3 level.

In summary, voltage supplied to each bit line can be variably set because different data can be stored in the latch units according to the state of each memory cell.

Figure 6:
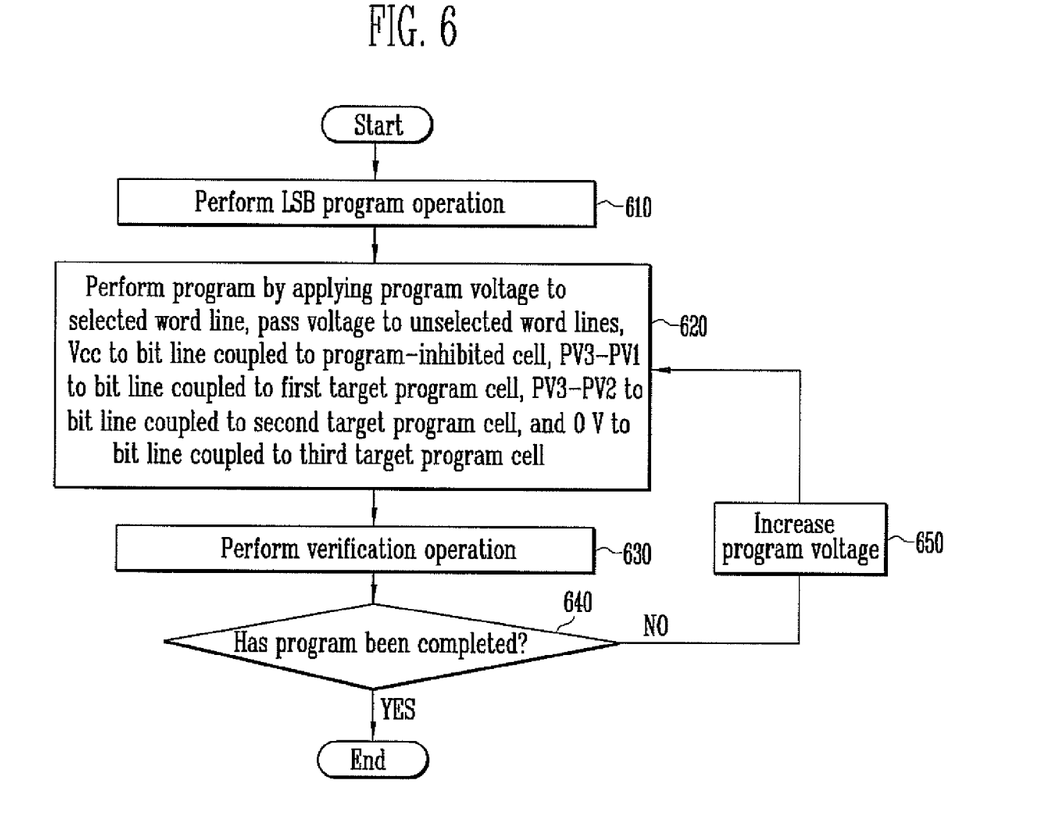
FIG. 6 is a flowchart illustrating a method of programming a nonvolatile memory device according to an embodiment of this disclosure.

FIG. 6 is a flowchart illustrating a method of programming a nonvolatile memory device according to an embodiment of this disclosure.

First, an LSB program operation is performed at step 610.

That is, as shown in FIG. 2A, a first state and a third state are formed by performing the LSB program operation.

An MSB program operation is then performed. Here, the program operation is performed by applying a program voltage (Vpgm) to a selected word line, a pass voltage (Vpass) to unselected word lines, a power source voltage (Vcc) to a bit line coupled to a program-inhibited cell, the voltage (PV3–PV1) in which the first reference voltage has been subtracted from the third reference voltage to a bit line coupled to a first target program cell, the voltage (PV3–PV2) in which the second reference voltage has been subtracted from the third reference voltage to a bit line coupled to a second target program cell, and a voltage of 0 V to a bit line coupled to a third target program cell at step 620.

According to such a configuration, a program voltage actually applied to a first target program cell (i.e., voltage applied between the gate and the channel of the cell) becomes Vpgm–(PV3–PV1), and a program voltage actually applied to a second target program cell becomes Vpgm–(PV3–PV2). Consequently, a point of time at which each of the target program cells is programmed with the corresponding reference voltage or more approaches a point of time at which the third target program cell is programmed with the third reference voltage or more.

A verification operation is performed on the program operation at step 630. That is, the verification operation is performed in order to check whether the first target program cell is programmed with the first reference voltage (PV1) or more, the second target program cell is programmed with the second reference voltage (PV2) or more, and the third target program cell is programmed with the third reference voltage (PV3) or more.

If, as a result of the verification operation, the target program cells have been programmed with the respective reference voltages or more, the program operation is terminated at step 640. However, if, as a result of the verification operation, the target program cells have not been programmed with the respective reference voltages or more at step 640, the program voltage is increased by a step voltage at step 650, and the program operation is then repeatedly performed at step 620.

Figure 7:
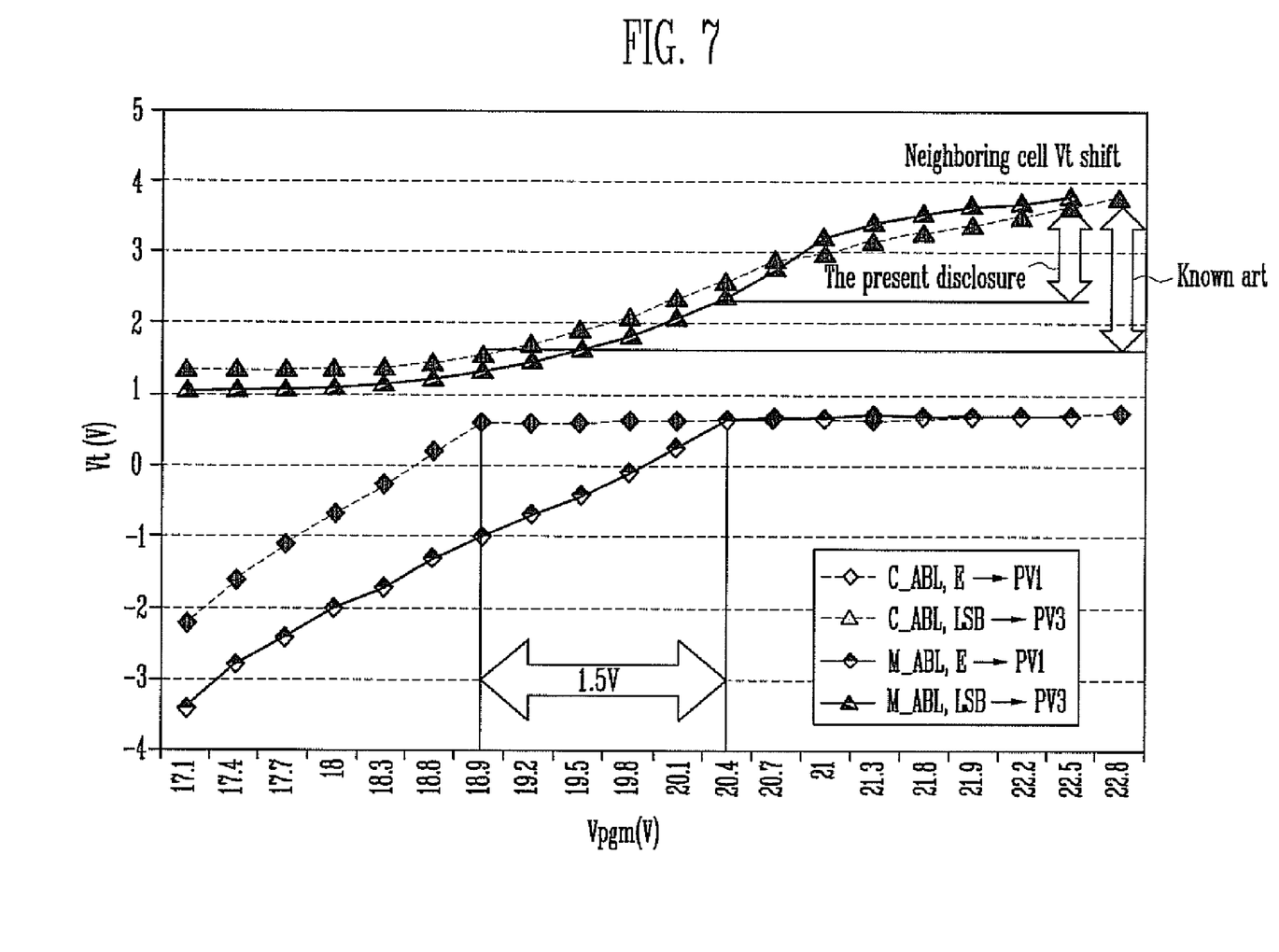
FIG. 7 is a graph showing effects obtained when a program operation using the nonvolatile memory device according to an embodiment of this disclosure is performed.

FIG. 7 is a graph showing effects obtained when a program operation using the nonvolatile memory device according to an embodiment of this disclosure is performed.

An X axis indicates program voltages applied to the gates of cells, and a Y axis indicates the threshold voltages of the cells. A dotted-line graph shows a shift in the threshold voltages in a known program method, and a solid-line graph shows a shift in the threshold voltages in the program method of this disclosure.

In the known program method, at the program voltage of 18.9V, the first target program cell is programmed with the first reference voltage or more for the first time, and the threshold voltage of the first target program cell then shifts about 2 V until the third target program cell is programmed with the third reference voltage or more. Such a shift in the threshold voltage causes an interference phenomenon for neighboring cells.

However, if voltage of 1.5 V is applied to the bit line of the first target program cell as in the present disclosure, at the program voltage of 20.4 V, the first target program cell is programmed with the first reference voltage or more for the first time. That is, a point of time at which a program is completed is delayed as much as a difference between voltages applied to bit lines. Subsequently, the threshold voltage shifts about 1 V until the third target program cell is programmed with the third reference voltage or more. Accordingly, interference between neighboring cells (i.e., cells adjacent to one another in the X direction) can be reduced because a shift in the threshold voltages of neighboring cells is reduced.

In summary, points of time at which target program cells are programmed with respective reference voltages or more are almost equal to one another, and program voltages applied at the points of time are almost equal to one another. To this end, a voltage of 0 V is applied to the bit line of the third target program cell, the voltage (PV3–PV2) in which the second reference voltage has been subtracted from the third reference voltage is applied to the bit line of the second target program cell, and the voltage (PV3–PV1) in which the first reference voltage has been subtracted from the third reference voltage is applied to the bit line of the first target program cell.

As described above, according to the present disclosure, points of time at which respective target program cells are programmed or program voltages applied at the respective points of time are almost equal to one another. Accordingly, interference phenomena resulting from a shift in the threshold voltages of neighboring cells can be reduced. In particular, interference in the X direction can be reduced.

Furthermore, a program start voltage further raised as compared to a known method can be applied. That is, a program start voltage can be increased by a raised bit line voltage. In this case, the number of times that a program operation and a verification operation are repeated in the ISPP method can be reduced. Accordingly, the throughput of the program operation can be increased.

What is claimed is:

1. A nonvolatile memory device, comprising:
a bit line voltage supply unit configured to supply a first voltage, a second voltage in which a second reference voltage has been subtracted from a third reference voltage, or a third voltage in which a first reference voltage has been subtracted from the third reference voltage according to data stored in a first latch unit, a second latch unit, and a third latch unit included in a page buffer; and
a bit line voltage setting unit configured to transfer a voltage of 0 V or an output voltage of the bit line voltage supply unit to a bit line according to the data stored in the first, second, and third latch units.

2. The nonvolatile memory device of claim 1, wherein:
when a memory cell is a program-inhibited cell, data '1' is stored in first nodes of all the first to third latch units,
when the memory cell is a first target program cell that is to be programmed with the first reference voltage or more, but to be programmed with less than the second reference voltage, data '1' is stored only in the first node of the first latch unit,
when the memory cell is a second target program cell that is to be programmed with the second reference voltage or more, but to be programmed with less than the third reference voltage, data '1' is stored only in the first node of the third latch unit, and
when the memory cell is a third target program cell that is to be programmed with the third reference voltage or more, data '0' is stored in the first nodes of all the first to third latch units.

3. The nonvolatile memory device of claim 1, wherein the bit line voltage supply unit comprises:
a first voltage supply unit configured to output the first voltage when a memory cell is a program-inhibited cell;
a second voltage supply unit configured to output the second voltage in which the second reference voltage has been subtracted from the third reference voltage when a memory cell is a second target program cell; and
a third voltage supply unit configured to output the third voltage in which the first reference voltage has been subtracted from the third reference voltage when a memory cell is a first target program cell.

4. The nonvolatile memory device of claim 3, wherein the first voltage supply unit comprises:
an AND gate configured to receive data of first nodes of the first to third latch units; and
an NMOS transistor configured to selectively couple an output terminal and an input terminal having the first voltage together according to an output of the AND gate.

5. The nonvolatile memory device of claim 3, wherein the second voltage supply unit comprises:
a NOR gate configured to receive data of first nodes of the first and second latch units;
an AND gate configured to receive data of the first node of the third latch unit and an output of the NOR gate; and
an NMOS transistor configured to selectively couple an output terminal and an input terminal having the second voltage in which the second reference voltage has been subtracted from the third reference voltage together according to an output of the AND gate.

6. The nonvolatile memory device of claim 3, wherein the third voltage supply unit comprises:
a NOR gate configured to receive data of first nodes of the second and third latch units;
an AND gate configured to receive data of the first node of the first latch unit and an output of the NOR gate; and
an NMOS transistor configured to selectively couple an output terminal and an input terminal having the third voltage in which the first reference voltage has been subtracted from the third reference voltage together according to an output of the AND gate.

7. The nonvolatile memory device of claim 1, wherein the bit line voltage supply unit comprises:
a first voltage supply unit configured to output the first voltage when data '1' is stored in first nodes of all the first to third latch units;
a second voltage supply unit configured to output the second voltage in which the second reference voltage has been subtracted from the third reference voltage when data '0' is stored in the first nodes of the first and second latch units and data '1' is stored in the first node of the third latch unit; and
a third voltage supply unit configured to output the third voltage in which the first reference voltage has been subtracted from the third reference voltage when data '0' is stored in the first nodes of the second and third latch units and data '1' is stored in the first node of the first latch unit.

8. The nonvolatile memory device of claim 7, wherein the first voltage supply unit comprises:
an AND gate configured to receive data of the first nodes of the first to third latch units; and
an NMOS transistor configured to selectively couple an output terminal and an input terminal having the first voltage together according to an output of the AND gate.

9. The nonvolatile memory device of claim 7, wherein the second voltage supply unit comprises:
a NOR gate configured to receive data of the first nodes of the first and second latch units;
an AND gate configured to receive data of the first node of the third latch unit and an output of the NOR gate; and
an NMOS transistor configured to selectively couple an output terminal and an input terminal having the second voltage in which the second reference voltage has been subtracted from the third reference voltage together according to an output of the AND gate.

10. The nonvolatile memory device of claim 7, wherein the third voltage supply unit comprises:
a NOR gate configured to receive data of the first nodes of the second and third latch units;
an AND gate configured to receive data of the first node of the first latch unit and an output of the NOR gate; and
an NMOS transistor configured to selectively couple an output terminal and an input terminal having the third voltage in which the first reference voltage has been subtracted from the third reference voltage together according to an output of the AND gate.

11. The nonvolatile memory device of claim 3 wherein the bit line voltage setting unit transfers the voltage of 0 V to the bit line when a memory cell is a third target program cell to be programmed with the third reference voltage or more.

12. The nonvolatile memory device of claim 1, wherein the bit line voltage setting unit comprises:
a bit line voltage transfer unit configured to transfer an output voltage of the bit line voltage supply unit to the bit line according to the data stored in the first to third latch units; and
a control circuit configured to drive the bit line voltage transfer unit or a bit line sense unit according to the data stored in the first to third latch units.

13. The nonvolatile memory device of claim 12, wherein the bit line voltage transfer unit comprises:
an inverter configured to invert an output of the control circuit, and
an NMOS transistor turned on in response to an output of the inverter and coupled between an output terminal of the bit line voltage supply unit and a bit line common node.

14. The nonvolatile memory device of claim 12, wherein the control circuit comprises a NOR gate configured to receive data of first nodes of the first to third latch units.

15. A nonvolatile memory device, comprising:
a first latch unit, a second latch unit, and a third latch unit each coupled to a sense node and configured to store data;

a bit line sense unit configured to selectively couple the sense node and a bit line selection unit together;

a bit line voltage supply unit configured to supply a first voltage, a second voltage in which a second reference voltage has been subtracted from a third reference voltage, or a third voltage in which a first reference voltage has been subtracted from the third reference voltage according to data stored in the first to third latch units; and a bit line voltage setting unit configured to drive the bit line sense unit according to the data stored in the first to third latch units and to transfer a voltage of 0 V or an output voltage of the bit line voltage supply unit to a bit line.

16. The nonvolatile memory device of claim 15, wherein when a program operation is performed, the bit line voltage setting unit selectively supplies the bit line with the voltage of 0 V, the first voltage, the second voltage in which the second reference voltage has been subtracted from the third reference voltage, or the third voltage in which the first reference voltage has been subtracted from the third reference voltage according to the data stored in the first to third latch units.

17. The nonvolatile memory device of claim 15, wherein the bit line voltage supply unit outputs:

the first voltage when a memory cell is a program-inhibited cell;

the second voltage in which the second reference voltage has been subtracted from the third reference voltage when a memory cell is a second target program cell; and the third voltage in which the first reference voltage has been subtracted from the third reference voltage when a memory cell is a first target program cell.

18. A method of programming a nonvolatile memory device, comprising:

providing the nonvolatile memory device on which a least significant bit (LSB) program operation has been performed; and performing a program operation by applying a program voltage to a selected word line, a pass voltage to unselected word lines, a first voltage to a bit line coupled to a program-inhibited cell, a third voltage in which a first reference voltage has been subtracted from a third reference voltage to a bit line coupled to a first target program cell, a second voltage in which a second reference voltage has been subtracted from the third reference voltage to a bit line coupled to a second target program cell, and a voltage of 0 V to a bit line coupled to a third target program cell.

19. The method of claim 18, further comprising performing a verification operation to check whether the first target program cell has been programmed with the first reference voltage or more, the second target program cell has been programmed with the second reference voltage or more, and the third target program cell has been programmed with the third reference voltage or more.

20. The method of claim 19, further comprising:

terminating the program operation, if, as a result of the verification operation, the first to third target program cells have been programmed with the first to third reference voltages or more, respectively; and increasing the program voltage by a step voltage and repeatedly performing the program operation, if, as a result of the verification operation, the first to third target program cells have not been programmed with the first to third reference voltages or more, respectively.

21. The method of claim 18, wherein:

the third voltage in which the first reference voltage has been subtracted from the third reference voltage is set to be less than the first voltage and more than the second voltage in which the second reference voltage has been subtracted from the third reference voltage, and the second voltage in which the second reference voltage has been subtracted from the third reference voltage is set to be more than the voltage of 0 V.

22. A nonvolatile memory device, comprising:

latch units configured to latch data to be programmed into a memory cell;

a control circuit configured to generate a control signal in response to outputs of the latch units;

a bit line voltage supply unit configured to generate a number of selection signals in response to the outputs of the latch units and to output a selected one of a number of bit line precharge voltages in response to a number of the selection signals; and a bit line voltage transfer unit configured to supply the selected bit line precharge voltage to a selected bit line in response to the control signal.

23. The nonvolatile memory device of claim 22, further comprising:

data transmission units each configured to output data stored in a selected one of the latch units in response to a data transmission signal;

a bit line sense unit configured to transfer the data outputted from the data transmission units to the selected bit line in response to the control signal; and a bit line selection unit configured to supply data outputted from the bit line sense unit or the selected bit line precharge voltage of the bit line voltage supply unit to the selected bit line in response to a bit line selection signal.

24. The nonvolatile memory device of claim 22, wherein the latch units latch data for programming the memory cell at a highest voltage level or other voltage levels.

25. The nonvolatile memory device of claim 24, wherein the control circuit outputs the control signal of a first voltage level when programming the memory cell at the highest voltage level and outputs the control signal of a second level when programming the memory cell at the other voltage levels.

26. The nonvolatile memory device of claim 25, wherein the control circuit comprises a NOR gate configured to output the control signal of the first level or the second level in response to the outputs of the latch units.

27. The nonvolatile memory device of claim 22, wherein the bit line voltage supply unit comprises:

a first voltage supply unit configured to output a first bit line precharge voltage of a power source voltage level in response to the outputs of the latch units;

a second voltage supply unit configured to output a second bit line precharge voltage which is less than the first bit line precharge voltage and more than 0 V in response to the outputs of the latch units; and a third voltage supply unit configured to output a third bit line precharge voltage which is less than the second bit line precharge voltage and more than 0 V in response to the outputs of the latch units.

* * * * *